United States Patent
Sarraf et al.

(10) Patent No.: US 6,169,660 B1
(45) Date of Patent: Jan. 2, 2001

(54) STRESS RELIEVED INTEGRATED CIRCUIT COOLER

(75) Inventors: David B. Sarraf, Elizabethtown; Jerome E. Toth, Hatboro; Nelson J. Gernert, Elizabethtown, all of PA (US)

(73) Assignee: Thermal Corp., Georgetown, DE (US)

( * ) Notice: Under 35 U.S.C. 154(b), the term of this patent shall be extended for 0 days.

(21) Appl. No.: 09/431,368

(22) Filed: Nov. 1, 1999

(51) Int. Cl.⁷ ........................................................ H05K 7/20
(52) U.S. Cl. .................... 361/717; 361/710; 361/784; 165/104.26; 165/104.33; 257/718; 257/724; 174/16.3
(58) Field of Search .................... 361/692–697, 361/687, 702–710, 714–719, 784, 700, 722, 685; 174/15.2, 252, 16.3; 165/104.22, 104.26, 47, 165, 45, 104.29, 104.33, 189, 185; 257/6, 7, 706–727

(56) References Cited

U.S. PATENT DOCUMENTS

| | | | |
|---|---|---|---|
| 3,143,592 | 8/1964 | August | 174/15 |
| 3,604,503 | 9/1971 | Feldman et al. | 165/96 |
| 4,040,478 | 8/1977 | Pogson et al. | 165/105 |
| 4,204,246 | 5/1980 | Arii et al. | 361/385 |
| 4,236,288 | * 12/1980 | Rohner | 29/157.3 H |
| 4,880,052 | * 11/1989 | Meyer et al. | 165/104.14 |
| 4,921,041 | * 5/1990 | Akachi | 165/104.29 |
| 5,095,404 | 3/1992 | Chao | 361/385 |
| 5,329,425 | 7/1994 | Leyssens et al. | 361/701 |
| 5,331,510 | * 7/1994 | Ouchi et al. | 361/702 |
| 5,339,214 | 8/1994 | Nelson | 361/695 |
| 5,384,940 | * 1/1995 | Soule et al. | 24/453 |
| 5,549,155 | 8/1996 | Meyer, IV et al. | 165/104.33 |
| 5,654,876 | * 8/1997 | Sathe et al. | 361/704 |
| 5,917,699 | * 6/1999 | Hung et al. | 361/697 |
| 5,925,929 | * 7/1999 | Kuwahara et al. | 257/714 |

FOREIGN PATENT DOCUMENTS

411045967A * 2/1999 (JP) .......................... H01L 23/467

* cited by examiner

Primary Examiner—Leo P. Picard
Assistant Examiner—Michael Datskovsky
(74) Attorney, Agent, or Firm—Martin Fruitman

(57) ABSTRACT

The invention is an integrated circuit cooler in which a heat spreader is mounted atop a weight sensitive integrated circuit package, and at least one heat pipe is attached to the heat spreader and to a cooling fin assembly remote from the heat spreader. To accommodate to the tolerances, the potential tilt of the installed integrated circuit package, and the weight of the fins, the heat spreader is mounted on the integrated circuit package using springs on posts attached to the circuit mounting board, and the heat pipe has an annealed section of the casing located between the heat spreader and the fins to relieve the potential stress on the thermal connection or the integrated circuit package. Another feature of the assembly is that the fins are mounted on the heat pipe using only spring clamps formed into the fins.

8 Claims, 1 Drawing Sheet

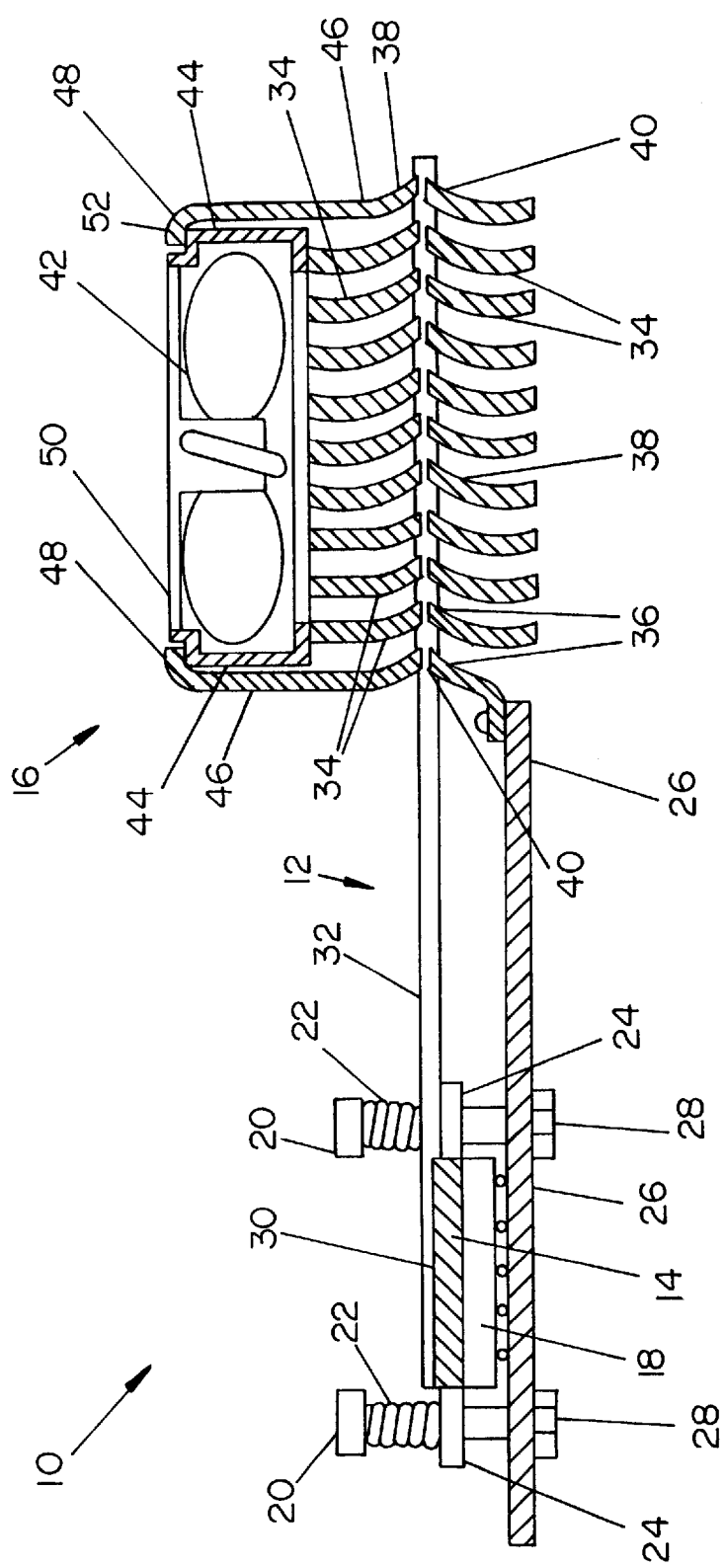

STRESS RELIEVED INTEGRATED CIRCUIT COOLER

BACKGROUND OF THE INVENTION

This invention deals generally with the cooling of integrated circuit packages, and more specifically with a cooler designed to prevent stress on an integrated circuit package caused by the weight of the cooler or the torque of a cooler separated from the integrated circuit package by a long lever arm.

One of the more common high speed methods for mounting integrated circuit chips into electronic systems uses what is called the "ball grid array". In this approach, the integrated circuit package is furnished with tiny balls of solder temporarily attached to its bottom with flux, with one solder ball located at each of its electrical contacts. In order to install the integrated circuit package, it is placed upon a printed circuit wiring board such as a graphics card which has a pattern of contacts that matches the pattern of the solder balls, and the entire assembly is heated to the melting point of the solder. The solder then melts, wets the contacts on both the integrated circuit package and the circuit board, and bonds the two sets of contacts together.

As the solder melts, the balls shrink and cause the integrated circuit package to settle somewhat onto the circuit board, but this settling movement is unpredictable. Therefore, the final clearance between the integrated circuit package and the circuit board can vary between integrated circuit packages and even from corner to corner on a single package. This variation in the clearance between the integrated circuit package and the circuit board causes a similar variation in the location of the top of the integrated circuit package, and that causes a problem in the use of cooling devices with the integrated circuit packages.

Since a basic requirement of cooling is that there be continuous intimate contact between the surface of the cooler and the surface of the device being cooled, the unpredictable variation in the height of the integrated circuit package requires the use of a cooling arrangement that can accommodate to the height variation. However, other requirements in the typical cooling arrangement make the accommodation to the height variation a significant problem. For instance, when an assembly of fins is used as the heat disposal device, these fins, sometimes with an associated fan, have a weight which the integrated circuit package itself can not support. The fins must then be rigidly supported from some other structure. The connection to the fins must also somehow adjust to the integrated circuit package height variation, again, without placing excessive force on the weight sensitive integrated circuit package.

It would be very advantageous to have a cooler which would permit intimate contact between the integrated circuit package and a cooling device, but not place significant mechanical stress on the integrated circuit package.

SUMMARY OF THE INVENTION

The present invention provides an integrated circuit cooler in which the cooling fin structure, or the cooling fin and fan assembly, is mounted on the circuit board, but the attachment to the integrated circuit package is separated from the fin structure by one or more heat pipes. In the prior art such an arrangement actually increased the risk of damage to the integrated circuit package and loss of thermal contact because the force to which the attached heat spreader was subjected was then applied as a torque because of the length of the heat pipe. However, in the present invention the heat pipe is constructed in such a manner so as to isolated the integrated circuit package and the attached heat spreader from the force originating at the cooling fin structure.

While the heat pipe is not actually flexible, its casing has an annealed section between the cooling fin structure and the integrated circuit package so that minor misalignments caused by variations in the height or tilt of the integrated circuit package are easily accommodated during installation by bending of the heat pipe at the annealed section. The annealed section of the casing of the heat pipe is actually located between two end sections.

One end section is attached to a heat spreader which is held in thermal contact with the integrated circuit package. The heat spreader is typically a solid copper sheet with one or more holes or channels formed parallel to its surface. At least one heat pipe, often more, is bonded into a hole or channel in the heat spreader. This attachment can be made by soldering, brazing, or the use of a heat conductive epoxy or adhesive. Once a heat pipe is installed into such a close fitting hole or channel, it really does not matter whether that part of its casing is annealed or not. The solid heat spreader block makes the heat pipe casing quite rigid.

In order to assure that the heat spreader is held in intimate contact with the integrated circuit package regardless of the specific height or tilt of the integrated circuit package, the heat spreader is held down against the integrated circuit package by springs. These springs are installed upon posts which are attached to the circuit board to which the integrated circuit package is attached. The posts typically penetrate through loose clearance holes in extensions of the heat spreader. The combination of the springs which permit adjustment perpendicular to the plane of the circuit board and the loose clearance holes, which permit minor adjustment in a plane parallel to the circuit board, allows the heat spreader and its attached heat pipe to accommodate to variations in both the height and the tilt of the integrated circuit package.

However, such adjustment capability would be of no benefit if the heat pipes attached to the heat spreader were themselves very rigid, as are typical prior art heat pipes. Rigid heat pipes would prevent the heat spreader from moving vertically or tilting, and proper contact between the heat spreader and the integrated circuit package could not be maintained when, as with the use of "ball grid array" soldering, very tight tolerances are not maintained.

In the present invention, the heat pipe or heat pipes used are processed so that the portions of their casings extending between the low mass heat spreader and a high mass cooling fin assembly are annealed to be much softer and more pliable than prior art heat pipes. The casing annealing is restricted only by the limit imposed by the strength required to prevent the casing from deforming from the pressure differentials to which it is subjected during operation. This pressure differential is typically 15 psi.

The end of the heat pipe opposite from the end at the integrated circuit package is attached to an assembly of cooling fins. In the preferred embodiment of the invention, each fin is formed with enough holes to match the number of heat pipes being used, and the sets of holes in all the fins have the same location on the fins. Small cups are formed into the fins at each hole as the holes are being made, and the sides of each cup are slitted. This forms a simple spring clamp at each hole in a fin to hold tightly onto the heat pipe. Thus, the individual fins can be assembled onto the heat pipes and they remain attached and provide a good thermal interface without any other bonding material.

The present invention also includes a feature which provides a simple and inexpensive means for attaching a fan to the cooling fins to provide cooling capability beyond that available with only natural convection. To attach a "pancake" type fan, a fan that is characterized by its small height and is usually constructed with a close fitting frame surrounding it, the fan frame is located in direct contact with the edges of the fins of the cooling fin assembly. To hold the fan in this location the end fins of the assembly are made larger than the other fins, and they extend above the sides of the installed fan frame, or tabs or strips attached to the end fins extend higher than the other fins and above the sides of the frame of the fan. The extra length of the end fins, or the tabs on the end fins, which extend over the sides of the fan are then bent over on top of the frame of the fan and hold the fan securely in place.

In effect, the end fins form a two sided additional frame which holds the fan. Furthermore, since many such fans have recesses and holes to accept attachment screws, tabs formed atop the end fins can be shaped and bent to fit into those recesses, and the finished installation has no protrusions above the fan itself.

The invention permits longer assemblies of cooling fins without endangering the integrated circuit package or covering up other circuit board components. This invention allows outboarding the cooling fin assembly, that is, mounting the fins beyond the edge of the circuit board, even though such a configuration usually endangers the thermal contact and increases the stress on the integrated circuit package and its connections because of the potential of movement of the higher mass fin assembly caused by shock or vibration to which the computer may be subjected.

When used with a graphics card installed within a computer, this outboarding also permits using fins which are short enough to be installed within the typical less than 1 inch spacing which separates multiple cards within a computer, and also allows the fins to be separated from the cards far enough to encourage natural convection, which is otherwise blocked by the cards themselves. Furthermore, fins installed beyond the edges of the circuit boards are not affected by the heat from other components on the circuit boards. In fact the present invention makes it quite practical to install the fin assembly adjacent to or outside the walls of the computer cabinet.

The present invention thereby supplies a simple and efficient integrated circuit package cooler which not only cools the integrated circuit package more efficiently than former devices, but also protects the thermal contact and the integrated circuit package from damage by movement of the significant mass of the cooling fins or the cooling fan.

BRIEF DESCRIPTION OF THE DRAWING

The FIGURE is a partial cross section side view of the preferred embodiment of the invention.

DETAILED DESCRIPTION OF THE INVENTION

The FIGURE is a partial cross section side view of the preferred embodiment of cooler 10 of the invention in which heat pipe 12 interconnects heat spreader 14 and cooling fin assembly 16.

Heat spreader 14 is held in contact with integrated circuit package 18 by posts 20 which hold springs 22 pressing upon extensions 24 of heat spreader 14. Posts 20 are installed and held on circuit board 26 by the use of nuts 28, and go through loose holes in extensions 24 so that exact alignment is not necessary. Springs 22 and the loose fit of posts 20 permit heat spreader 14 to accommodate to substantial variations in the height of the top of integrated circuit package 18, not only variations among different integrated circuit packages but also variations from edge to edge of a single integrated circuit package.

In the preferred embodiment shown in the FIGURE, heat pipe 12 is bonded to heat spreader 14 within slot 30 formed in the top of heat spreader 14. Heat pipe 12 then extends from heat spreader 14 to cooling fin assembly 16, with intermediate annealed section 32 of heat pipe 12 spanning between heat spreader 14 and cooling fin assembly 16. Annealed section 32 of the casing of heat pipe 12 provides a vital function for cooler 10.

Because the exact location of heat spreader 14 is unpredictable from installation to installation, and cooling fin assembly 16, because of its substantial weight, must be anchored to something such as circuit board 26, heat pipe 12 must be capable of adjustment, at least slightly, during each installation, and be capable of withstanding the stress caused by shock induced movement of fin assembly 16. If heat pipe 12 were absolutely rigid and heat spreader 14 were rigidly attached to integrated circuit package 18, the thermal contact between heat spreader 14 and integrated circuit package 18 and integrated circuit package 18 itself might be subjected to significant and destructive stress, not only during installation, but also with any later vibration during transport.

Furthermore, if a spring loaded installation of heat spreader 14, as disclosed in the invention, were used with a rigid heat pipe, it would be most likely that the forces from the anchored cooling fin structure transmitted through the lever arm of the rigid heat pipe would either compress the integrated circuit package enough to damage it, or would lift the heat spreader off the integrated circuit package and destroy the thermal connection.

The simple solution to this problem is to process heat pipe 12 so that annealed section 32 of the heat pipe casing isolates heat spreader 14 from cooling fin assembly 16. The extent of the annealing is restricted only by the limit imposed by the strength required to prevent the casing from deforming from the pressure differentials to which it is subjected during operation. This pressure differential is typically 15 psi.

Annealed section 32 of heat pipe 12 permits simple and non-destructive occasional minor deflection of the casing of heat pipe 12, and because of the annealed casing there will be no internal elastic force attempting to a realign the heat pipe into its original position. This is particularly helpful as cooler 10 is being installed to cool an integrated circuit package at which time heat spreader 14 and cooling fin assembly 16 need not be kept in perfect alignment, either vertically or horizontally. Even the use of more than one heat pipe does not prevent minor repositioning of heat spreader 14. It should be appreciated that the internal structure of most heat pipes will also not be damaged by minor deflection.

The processing which provides this annealing is well understood by those skilled in metallurgy, and is simply to raise heat pipe 12 to a temperature of 450 degrees centigrade.

The attachment of fins 34 to heat pipe 12 is another feature of the invention. A very simple and economical method of installing fins 34 onto heat pipe 12 is to simply form holes 36 within fins 34, to form small drawn cups 38 into fins 34 as holes 36 are being made, and to provide the sides of cups 38 with slits 40. With the space between the fingers formed by slits 40 slightly smaller than heat pipe 12, a simple spring clamp is formed in each fin 34 to hold tightly onto heat pipe 12.

It should be appreciated that in most applications cooling fin assembly 16 is firmly attached to circuit board 26 or some other structure. However, the attachment method is not significant to or a part of the present invention.

The present invention also includes an option which provides a simple and inexpensive means for attaching a fan to the cooling fins to provide cooling capability beyond that available from natural convection alone. To attach a "pancake" type fan such as fan 42, fan frame 44 is placed directly upon the edges of fins 34 of the cooling fin assembly 16. To hold the fan in this location, end fins 46 are made larger than the other fins 34, and end fins 46 extend above the sides of the fan frame 44. Actually, the entire width of end fins 46 need not be extended. Tabs or thin strips attached to the end fins can also be used as the parts which extend higher than the other fins and above the sides of the frame of the fan. The extra lengths of end fins 46 which extend beyond and above the sides of the fan, or the tabs or strips on the end fins, are then bent over to form lips 48 in contact with top 50 of fan frame 44, and lips 48 hold fan frame 44 securely in place.

It is also possible to form the tabs on end fins 46 to match the orientation of recesses and holes which many fans have to accept attachment screws. For such fans, tabs formed atop the end fins 46 can be bent to fit into recesses 52, and, as shown in the FIGURE, the finished installation has no protrusions above the fan.

The present invention thereby furnishes an integrated circuit package cooler which can be easily installed and which does not endanger the integrated circuit package or thermal contact because it relieves the mechanical stress often applied to integrated circuit packages by the attachment of a cooling fin assembly.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

For example, fins 34 could be conventionally bonded to heat pipe 12 rather than using drawn cup structure 38 as shown.

What is claimed as new and for which Letters patent of the United States are desired to be secured is:

1. An integrated circuit package cooler comprising:
   a heat conductive heat spreader in thermal contact with an integrated circuit package;
   a cooling fin assembly located remote from the integrated circuit package; and
   at least one heat pipe with a first section attached to the heat spreader, a second section attached to the cooling fin assembly, and an unsupported intermediate section between the first section and the second section, with the intermediate section annealed to a condition such that, when the intermediate section is deflected, the heat pipe does not produce any elastic force attempting to reshape the heat pipe into its condition before it was deflected;
   wherein the fin assembly comprises multiple fins attached to the heat pipes with the heat pipes penetrating drawn cups which have slits in the cups' sides to form spring clamps.

2. The integrated circuit package cooler of claim 1 wherein the fin assembly comprises multiple fins attached to the heat pipes with the heat pipes penetrating drawn cups which have slits in the cups' sides to form spring clamps.

3. An integrated circuit package cooler comprising:
   a heat conductive heat spreader in thermal contact with an integrated circuit package;
   a cooling fin assembly located remote from the integrated circuit package;
   at least one heat pipe with a first section attached to the heat spreader, a second section attached to the cooling fin assembly, and an intermediate section between the first section and the second section, with the intermediate section annealed to a condition such that, when the intermediate section is deflected, the heat pipe does not produce any elastic force attempting to reshape the heat pipe into its condition before it was deflected;
   wherein the fin assembly comprises multiple fins attached to the heat pipes and a fan mounted to move air across the fins; and
   wherein the fan is held onto the fan assembly by extensions on at least two fins with the extensions deformed to hold the fan in position.

4. The integrated circuit package cooler of claim 3 wherein the extensions are attached to end fins of the fin assembly.

5. An integrated circuit package cooler comprising:
   a heat conductive heat spreader in thermal contact with an integrated circuit package;
   at least one heat pipe attached to the heat spreader; and
   a cooling fin assembly attached to the heat pipe and comprising multiple fins attached to the heat pipe with the heat pipe penetrating drawn cups which have slits in the cups' sides to form spring clamps.

6. The integrated circuit package cooler of claim 5 wherein the fin assembly comprises multiple fins attached to the heat pipes and a fan mounted to move air across the fins.

7. The integrated circuit package cooler of claim 6 wherein the fan is held onto the fan assembly by extensions on at least two fins with the extensions deformed to hold the fan in position.

8. The integrated circuit package cooler of claim 7 wherein the extensions are attached to end fins of the fin assembly.

\* \* \* \* \*